(12) United States Patent
Ilkbahar et al.

(10) Patent No.: US 7,132,335 B2
(45) Date of Patent: Nov. 7, 2006

(54) SEMICONDUCTOR DEVICE WITH LOCALIZED CHARGE STORAGE DIELECTRIC AND METHOD OF MAKING SAME

(75) Inventors: Alper Ilkbahar, San Jose, CA (US); Roy Scheuerlein, Cupertino, CA (US); Andrew J. Walker, Mountain View, CA (US); Luca Fasoli, San Jose, CA (US)

(73) Assignee: Sandisk 3D LLC, Sunnyvale, CA (US)

( * ) Notice: Subject to any disclaimer, the term of this patent is extended or adjusted under 35 U.S.C. 154(b) by 190 days.

(21) Appl. No.: 10/965,763

(22) Filed: Oct. 18, 2004

(65) Prior Publication Data
US 2005/0079675 A1   Apr. 14, 2005

Related U.S. Application Data

(62) Division of application No. 10/325,951, filed on Dec. 23, 2002, now Pat. No. 6,849,905.

(51) Int. Cl.
*H01L 21/336* (2006.01)

(52) U.S. Cl. ............... 438/286; 438/287; 438/264; 438/288; 438/151; 438/158; 257/E29.309; 257/E21.18; 257/E21.423; 257/E21.679

(58) Field of Classification Search ............. 438/286, 438/287, 264, 288, 151, 158; 257/E29.309, 257/E21.18, E21.423, E21.679
See application file for complete search history.

(56) References Cited

U.S. PATENT DOCUMENTS

| | | | |
|---|---|---|---|
| 4,281,397 A | | 7/1981 | Neal et al. |
| 5,268,319 A | | 12/1993 | Harari |
| 5,306,935 A | | 4/1994 | Esquivel et al. |
| 5,640,350 A | | 6/1997 | Iga |
| 5,674,764 A | * | 10/1997 | Liu et al. .............. 438/257 |
| 5,768,192 A | * | 6/1998 | Eitan .................. 365/185.24 |
| 5,956,588 A | * | 9/1999 | Choi et al. ............ 438/286 |
| 5,991,202 A | | 11/1999 | Derhacobian et al. |
| 6,157,058 A | * | 12/2000 | Ogura .................. 257/315 |
| 6,185,122 B1 | | 2/2001 | Johnson et al. |
| 6,249,454 B1 | | 6/2001 | Sung et al. |
| 6,258,668 B1 | | 7/2001 | Lee et al. |
| 6,327,182 B1 | | 12/2001 | Shum et al. |
| 6,465,307 B1 | * | 10/2002 | Chidambaram et al. .... 438/286 |
| 6,486,066 B1 | | 11/2002 | Cleeves et al. |
| 6,552,387 B1 | * | 4/2003 | Eitan .................... 257/324 |
| 6,566,699 B1 | * | 5/2003 | Eitan .................... 257/296 |

(Continued)

OTHER PUBLICATIONS

Institute of Electrical and Electronics Engineering, 2001 Digest of Technical Papers, vol. 44, ISSN 01CH37177, pp. 423-424.

(Continued)

*Primary Examiner*—George Fourson
(74) *Attorney, Agent, or Firm*—Foley & Lardner LLP

(57) ABSTRACT

An array of transistors includes a plurality of transistors, a plurality of word lines extending in a first direction and a plurality of bit lines extending in a second direction. Each transistor includes a source, a drain, a channel and a localized charge storage dielectric. A first transistor of the plurality of transistors and a second transistor of the plurality of transistors share a common source/drain. A first localized charge storage dielectric of the first transistor does not overlap the common source/drain and a second localized charge storage dielectric of the second transistor overlaps the common source/drain.

12 Claims, 11 Drawing Sheets

U.S. PATENT DOCUMENTS

| | | | |
|---|---|---|---|
| 6,768,156 B1 * | 7/2004 | Bhattacharyya | 257/314 |
| 6,815,764 B1 * | 11/2004 | Bae et al. | 257/324 |
| 2001/0055838 A1 | 12/2001 | Walker et al. | |
| 2002/0028541 A1 | 3/2002 | Lee et al. | |
| 2002/0064911 A1 * | 5/2002 | Eitan | 438/216 |
| 2002/0142546 A1 | 10/2002 | Kouznetsov et al. | |
| 2002/0192912 A1 * | 12/2002 | Divakaruni et al. | 438/286 |
| 2003/0201477 A1 * | 10/2003 | Eitan | 257/296 |
| 2004/0183126 A1 * | 9/2004 | Bae et al. | 257/324 |

OTHER PUBLICATIONS

Yoshikawa, K., "An Asymmetrical Lightly Doped Source Cell for Virtual Ground High-Density EPROM's," IEEE Transactions on Electron Devices, vol. 37, No. 4, 1990.

Young et al., "The Fabrication and Characterization of EEPROM Arrays on Glass Using a Low-Temperature Poly-Si TFT Process," IEEE Transactions on Electron Devices, vol. 43, No. 11, Nov. 1996.

* cited by examiner

SEMICONDUCTOR DEVICE WITH LOCALIZED CHARGE STORAGE DIELECTRIC AND METHOD OF MAKING SAME

FIELD OF THE INVENTION

The present invention is directed generally to semiconductor devices and methods of fabrication and more particularly to a charge storage transistor array and method of fabrication.

BACKGROUND OF THE INVENTION

Charge storage transistors are transistors which contain a charge storage region. These transistors may be used in memory devices, such as in electrically erasable programmable memories (EEPROM). The charge storage transistors may be programmed by Fowler-Nordheim (FN) tunneling or by channel hot electron (CHE) injection. In FN tunneling programming, a voltage is applied between a word line and a source or a drain bit line of a charge storage transistor. In CHE programming, a voltage is applied between a source bit line and a drain bit line of a charge storage transistor.

BRIEF SUMMARY OF THE INVENTION

A preferred embodiment of the present invention provides a charge storage transistor, comprising an active region comprising a source, a drain, and a channel located between the source and the drain, a gate electrode, and a localized charge storage dielectric located between and in contact with a tunneling dielectric and a blocking dielectric. A first transistor portion comprises (i) the source; (ii) a first channel portion located adjacent to the source; and (iii) a charge storage region which comprises the localized charge storage dielectric, a first portion of the tunneling dielectric and a first portion of the blocking dielectric. A second transistor portion comprises (i) the drain; (ii) a second channel portion located adjacent to the drain; (iii) a second portion of the tunneling dielectric; and (iv) a second portion of the blocking dielectric. The second transistor portion excludes the localized charge storage dielectric.

Another preferred embodiment of the present invention provides an array of transistors, comprising a plurality of transistors, each transistor of the plurality of transistors comprising a source, a drain, a channel and a localized charge storage dielectric, a plurality of word lines extending in a first direction and a plurality of bit lines extending in a second direction. A first transistor of the plurality of transistors and a second transistor of the plurality of transistors share a common source/drain. A first localized charge storage dielectric of the first transistor does not overlap the common source/drain. In one preferred aspect of the invention, a second localized charge storage dielectric of the second transistor overlaps the common source/drain. In another preferred aspect of the invention, the second localized charge storage dielectric of the second transistor does not overlap the common source/drain.

Another preferred embodiment of the present invention provides an array of transistors, comprising a plurality of charge storage transistors, wherein each charge storage transistor contains a charge storage region that is located adjacent to a source but not adjacent to a drain of the charge storage transistor, and a plurality of dummy transistors interspersed with the charge storage transistors. The dummy transistors lack a charge storage region comprising a localized charge storage dielectric.

Another preferred embodiment of the present invention provides a method of making an array of transistors, comprising first forming an active region or a word line film, second forming a charge storage dielectric layer over the active region or the word line film, third forming a first mask over a first plurality of regions on the charge storage dielectric layer, fourth patterning the charge storage dielectric layer using the first mask to form a plurality of localized charge storage dielectrics, and fifth forming the word line film over the plurality of localized charge storage dielectrics if the active region was formed first, or forming the active region over the plurality of localized charge dielectrics if the word line film was formed first. Each transistor of the array of transistors comprises a first lateral transistor portion comprising (i) a source; (ii) a first channel portion located adjacent to the source; and (iii) one of the localized charge storage dielectrics, and a second lateral transistor portion comprising (i) a drain and (ii) a second channel portion located adjacent to the drain, wherein the second transistor portion excludes a localized charge storage dielectric.

DETAILED DESCRIPTION OF THE PREFERRED EMBODIMENTS

U.S. published application 20020028541 which was filed as U.S. application Ser. No. 09/927,648, on Aug. 13, 2001 and which is incorporated by reference in its entirety, discloses a monolithic three dimensional array of charge storage transistors. In one embodiment of this application shown in FIGS. 83A to 85, the charge storage transistors are programmed by Fowler-Nordheim (FN) tunneling. The charge storage region of the transistors shown in FIGS. 84 and 85 is located near the source but not near the drain of the transistors. The floating gate and the tunneling dielectric of the charge storage region are removed from locations adjacent to the drain of the transistors, as shown in FIGS. 86G–J of this published application. As described in paragraph 0330 of this published application, the active region of each transistor is located in a discrete island to allow these transistors to be programmed by FN tunneling. Thus, an extra photolithographic patterning step is added to pattern a common polysilicon active layer into discrete active region islands. Isolation regions are located between the active region islands of each charge storage transistor. The isolation regions allow the charge storage transistors to be programmed by FN tunneling, but increase the effective cell size of the array.

The present inventors have realized that an extra photolithographic patterning step of the active layer may be eliminated by using a localized charge storage dielectric in an array of charge storage transistors. Adjacent charge storage transistors with an offset localized charge storage dielectric which share a common source/drain can be programmed by FN tunneling. This allows the transistors to be located closer together and reduces the effective cell size of the array.

Alternatively, the extra photolithographic patterning step of the active layer may be eliminated by locating dummy transistors which lack a charge storage region between charge storage transistors containing the localized charge storage region. Since the dummy transistors do not have to be located between each charge storage transistor, the effective cell size of the array is also reduced. The dummy devices also allow the use of lower power to program the array and cut off a-current leakage path in the array.

Furthermore, the present inventors realized that the tunneling dielectric does not have to be removed from adjacent to the transistor drain region during the step of etching the localized charge storage dielectric. By not etching the tunneling dielectric during the step of etching of a localized charge storage dielectric, over etching of the channel region can be avoided.

Figure 1:
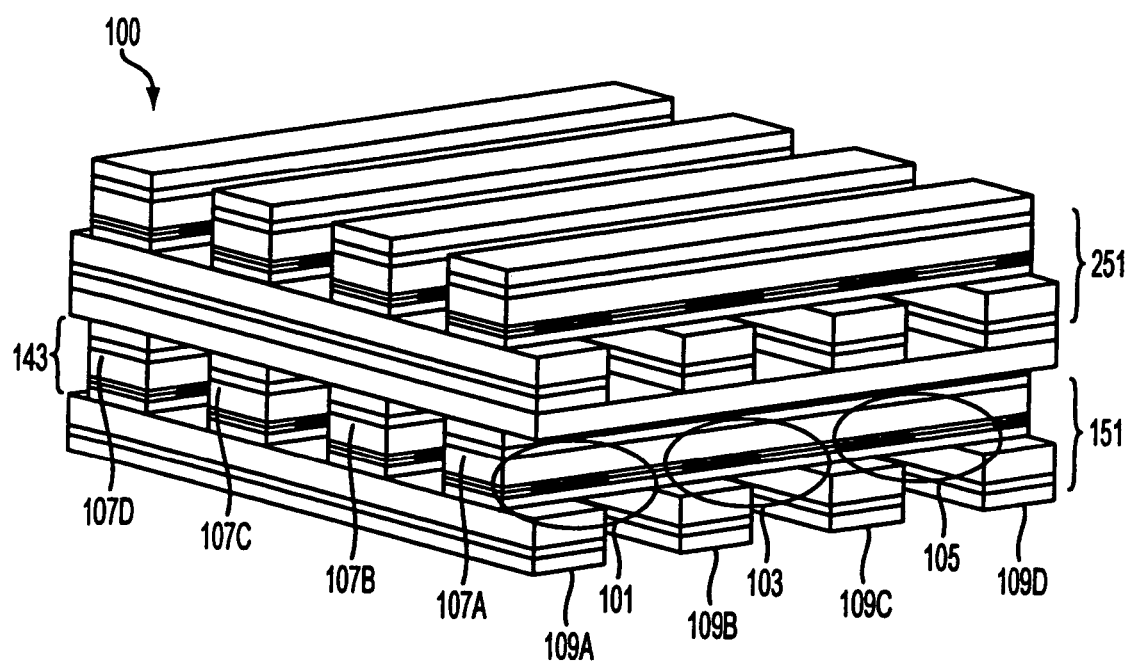
FIG. 1 is three dimensional view of an array according to the first preferred embodiment of the present invention.
Figure 2:
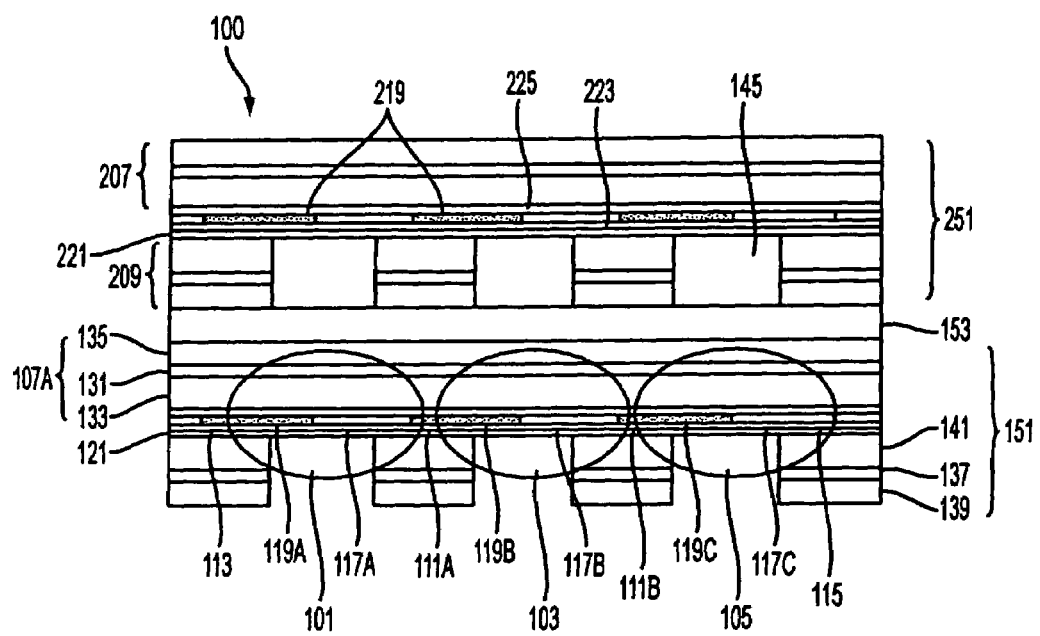
FIG. 2 is a front view of the array in FIG. 1.

FIGS. 1 and 2 illustrate an array 100 of transistors according the first preferred embodiment of the present invention. The array 100 is illustrated in FIGS. 1 and 2 as a monolithic three dimensional array of thin film transistors. However, the array 100 may comprise a two dimensional array (i.e., an array containing only one vertical device level) of any suitable transistors, such as thin film transistors or field effect transistors located in a semiconductor substrate.

The array 100 includes a plurality of transistors. For example, three transistors 101, 103 and 105 are illustrated in FIG. 1. It should be understood that the array 100 contains more than three transistors. The array 100 contains a plurality of word lines 107A, 107B, 107C, 107D extending in a first direction (for example, left to right in FIG. 1). The array also contains a plurality of bit lines 109A, 109B, 109C, 109D extending in a generally orthogonal second direction (for example, in and out of the page in FIG. 1).

The adjacent transistors of the array 100 share a common source/drain. For example, as shown in FIG. 2, the first transistor 101 and the second transistor 103 share a first common source/drain 111A. The second transistor 103 and the third transistor 105 share a second common source/drain 111B. Each common source/drain acts as a drain of the one transistor and as a source of the adjacent transistor. Thus, the first common source/drain 111A acts as a drain of transistor 101 and as a source of transistor 103. The second common source/drain 111B acts as a drain of transistor 103 and as a source of transistor 105.

Transistors on the edge of the array 100 (i.e., located in the first and last columns of the array) share only one common source/drain with an adjacent transistor. Other transistors in the array 100 share two common source/drains with adjacent transistors. Thus, if transistor 101 was located in the first column of the array, it would contain a non-shared source 113. If transistor 105 was located in the last column of the array 100, it would contain a non-shared drain 115.

Each transistor 101, 103, 105 of array 100 contains a respective channel 117A, 117B and 117C. The channel of each transistor is located between the source and the drain of each transistor. For example, channel 117B of the second transistor 103 is located between the common source/drains 111A and 111B.

Each transistor 101, 103, 105 of array 100 also contains a respective localized charge storage dielectric 119A, 119B, 119C. The first localized charge storage dielectric 119A of the first transistor 101 does not overlap the first common source/drain 111A. The second localized charge storage dielectric 119B of the second transistor 103 overlaps the first common source/drain 111A. Likewise, the second localized charge storage dielectric 119B of the second transistor 103 does not overlap the second common source/drain 111B. The third localized charge storage dielectric 119C of the third transistor 105 overlaps the second common source/drain 111B. Preferably, the localized charge storage dielectrics 119A, 119B, 119C comprise islands or discontinuous regions of electrically insulating material which can store charge.

The common source/drains 111A, 111B, non-shared source 113, non-shared drain 115 and the channels 117A, 117B, 117C are located in a first common semiconductor active region. If the transistors 101, 103, 105 comprise thin film transistors, then the semiconductor active region comprises a semiconductor layer 121, such as a polysilicon layer or an amorphous silicon layer, located over an insulating layer or substrate. If desired, a portion of the semiconductor active region may extend into the bit lines 109A–D if the bit lines contain a semiconductor material, such as heavily doped polysilicon. Thus, the common source/drains 111A, 111B may be located entirely or partially in the portions of the bit lines 109B, 109C underlying each respective transistor 101, 103, 105. Alternatively, a portion or the entire volume of the common source/drains 111A, 111B may be located in the semiconductor layer 121, as heavily doped regions of the opposite conductivity type to the doping of the semiconductor layer 121. If the transistors 101, 103, 105 comprise field effect transistors located in a single crystal semiconductor substrate, then the semiconductor active region comprises a portion of the single crystal semiconductor substrate, such as a silicon substrate, or an epitaxial silicon layer located on the single crystal silicon substrate.

Since the adjacent transistors of the array 100 share common source/drains 111A, 111B, the adjacent transistors of the array 100 also share a common bit lines 109B and 109C. The first common bit line 109B contacts the first common source/drain 111A. The second common bit line 109C contacts the second common source/drain 111B. The common bit lines 109B, 109C contact the respective common source/drains 111A, 111B from below if the common source/drains 111A, 111B are located entirely in the semiconductor layer 121. Alternatively, the common bit lines 109B, 109C contact edges of the respective common source/drains if the common source/drains 111A, 111B are located within the respective common bit lines 109B, 109C.

A first common word line 107A acts as a gate electrode for the first set of transistors located in the first row of the array 100. For example, the first transistor 101, the second transistor 103 and the third transistor 105 are located in the first set of transistors. Other word lines 107B, 107C, 107D, act as gate electrodes for other sets of transistors located behind the first set of transistors, (i.e., in different rows), as shown in FIG. 1.

The localized charge storage dielectric of each respective transistor of the first set of transistors is located adjacent only to a first side of each common source/drain. For example, as shown in FIGS. 1 and 2, localized charge storage dielectric 119B of the second transistor 103 is located only to the right of the common source/drain 111A. Localized charge storage dielectric 119C of the third transistor 105 is also located only to the right of the common source/drain 111B. Of course the localized charge storage dielectrics may be located to the left rather than to the right of each common source/drain if desired. For transistors in the first column of the array 100, such as for transistor 101, the localized charge storage dielectric 119A is located only to the right of the unshared source 113.

In a preferred aspect of the first preferred embodiment, the array 100 further contains a first tunneling dielectric 123 located in contact with the first common active region (i.e., with the semiconductor layer 121, as shown in FIGS. 1 and 2) and a first blocking dielectric 125 located in contact with the first common word line 107A. In alternative aspects of the first embodiment, the first tunneling dielectric 123 and the first blocking dielectric 125 may be omitted if the localized charge storage dielectric 119A, 119B and 119C comprises a material which does not require it to be located between a tunneling and a blocking dielectric to store charge.

The first tunneling dielectric 123 and the first blocking dielectric 125 contact each other adjacent to a second side of each common source/drain of the first set of transistors. Thus, as shown in FIGS. 1 and 2, the first tunneling dielectric 123 and the first blocking dielectric 125 contact each other adjacent to the left side of each common source/drain 111A, 111B, while the localized charge storage dielectrics 119B, 119C separate the first tunneling dielectric 123 and the first blocking dielectric 125 adjacent to the right side of each common source/drain 111A, 111B. Preferably, the first tunneling dielectric 123 and the first blocking dielectric 125 comprise continuous layers which extend through the first set of transistors 101, 103, 105. However, if desired, these dielectrics 123, 125 may comprise discontinuous regions.

Figure 3:
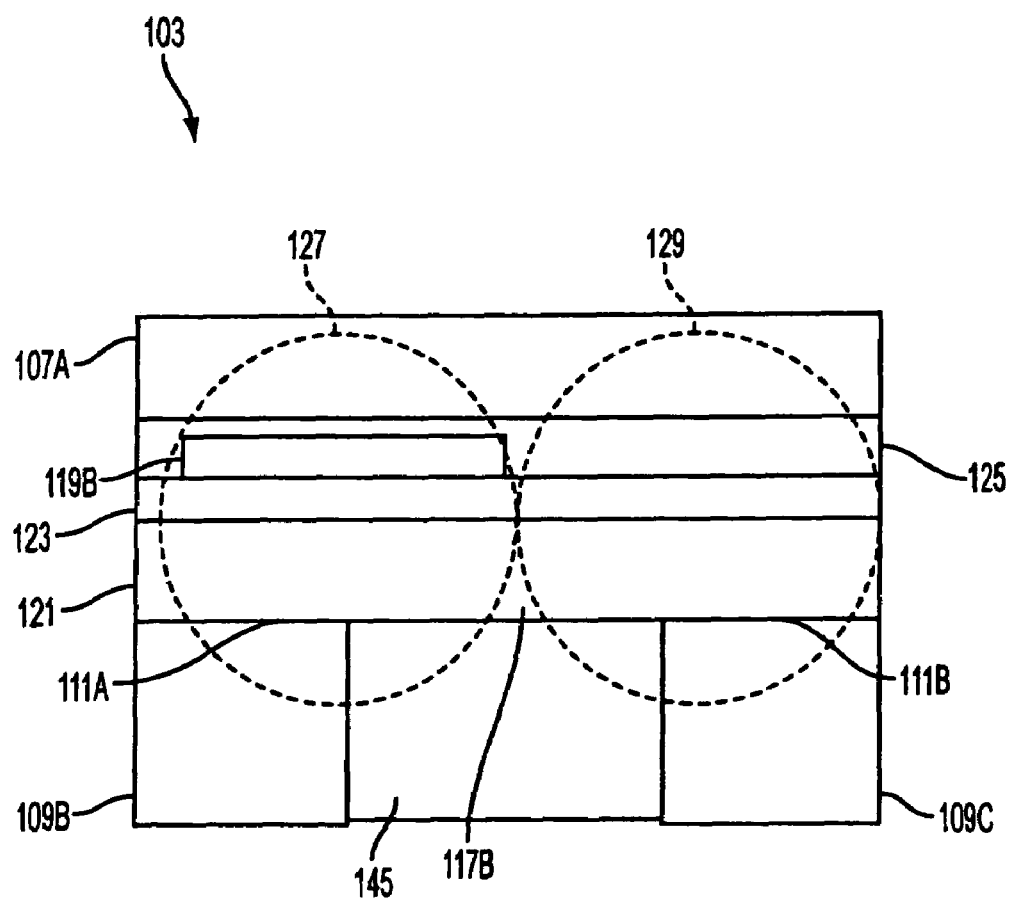
FIG. 3 is a side cross sectional view of a transistor according to the first preferred embodiment of the present invention.

FIG. 3 illustrates a close-up of transistor 103 shown in FIGS. 1 and 2. As shown in FIG. 3, the transistor 103 is a top gate staggered charge storage thin film transistor. The active region of the transistor 103 includes the first common source/drain 111A acting as the source of the transistor and the second common source/drain 111B acting as the drain of the transistor. The channel 117B is located between the source 111A and drain 111B of the transistor 103. A portion of the word line 107A overlying the channel 117B acts as the gate electrode of the transistor. The localized charge storage dielectric 119B is located between and in contact with the tunneling dielectric 123 and the blocking dielectric 125.

A first portion 127 of transistor 103 is shown by dashed lines in FIG. 3. This portion 127 includes (i) the source 111A; (ii) the left side channel 117B portion located adjacent to the source 111A; and (iii) a charge storage region which comprises the localized charge storage dielectric 119B, a left side portion of the tunneling dielectric 123 and a left side portion of the blocking dielectric 125 located in the circle 127.

A second portion 129 of transistor 103 is shown by dashed lines in FIG. 3. This portion includes (i) the drain 111B; (ii) the right side channel 117B portion located adjacent to the drain 111B; (iii) a right side portion of the tunneling dielectric 123; and (iv) a right side portion of the blocking dielectric 125. The second transistor portion 125 excludes the localized charge storage dielectric 119B. In the second transistor portion 129, the right side portion of the tunneling dielectric 123 contacts the right side portion of the blocking dielectric 125.

Any suitable materials may be used to form the transistors of the array 100, including transistors 101, 103 and 105. The word lines 107A, 107B, 107C and 107D and the bit lines 109A, 109B, 109C and 109D may comprise any one or more conductive materials suitable for use as electrodes of semiconductor devices. Preferably, the word lines 107A, 107B, 107C and 107D include a metal silicide layer or region 131 located between two heavily doped polysilicon layers or regions 133, 135, as shown in FIG. 2. The bit lines 109A, 109B, 109C and 109D also preferably include a metal silicide layer or region 137 located between two heavily doped polysilicon layers or regions 139, 141, as shown in FIG. 2.

The first tunneling dielectric 123 preferably comprises a silicon dioxide layer, the localized charge storage dielectric of each transistor 101, 103, 105 preferably comprises a silicon nitride layer and the first blocking dielectric 125 preferably comprises a silicon dioxide layer. However, other materials may be used instead. For example, one or both of the tunneling dielectric 123 and the blocking dielectric 125 may comprise a metal oxide layer, such as $Al_2O_3$, $Ta_2O_5$, $Y_2O_3$, CaO, MgO or $ZrO_2$. The localized charge storage dielectric may comprise silicon oxynitride, an insulating material (such as silicon dioxide) containing metal nanocrystals, an insulating material (such as silicon dioxide) containing hydrogen ions, or a metal oxide material or layer, such as $Ta_2O_5$, $ZrO_2$ or $HfO_2$.

The localized charge storage dielectric 119B of transistor 103 is offset from the drain 111B in a drain to source 111A direction by a distance sufficient to avoid charge storage in the localized charge storage dielectric when a programming voltage is applied between the drain 111B through bit line 109C and the word line 107A (i.e., the gate electrode of the transistor 103). Thus, the transistors of the array 100, such as transistor 103, are programmed by Fowler-Nordheim tunneling, such that electrons are trapped adjacent to the source 111A in the localized charge storage dielectric, but electrons are not trapped adjacent to the drain 111B in the tunneling dielectric 123 and in the blocking dielectric 125 in a quantity sufficient to alter a threshold voltage of the transistor 103. Any electron tunneling above the drain of a selected transistor will not cause a shift in the threshold voltage of the transistor. In other words, applying a low drain voltage to the selected transistor while the word line of the transistor is kept at a high voltage will not program the device. The array 100 thus has a virtual ground array (VGA) layout with no isolation regions between the transistors, while using FN tunneling as the programming mechanism.

It should be noted that in general, a source and a drain of a transistor can be reversed depending on the direction of current flow through the transistor. As used herein, a source is the region adjacent to the localized charge storage dielectric and a drain is the region distal from the localized charge storage dielectric.

The array 100 may have any suitable layout. Preferably, at least a portion of the first common active region (i.e., of semiconductor layer 121), the localized charge storage dielectric 119A, 119B, 119C of each transistor, the first tunneling dielectric 123, the first blocking dielectric 125 and the first common word line 107A are located in a first rail stack 143 extending in the first direction, as shown in FIG. 1. The rail stack 143 is patterned using the same mask during the same etching step, as will be described in more detail below, such that it has planar, aligned sidewalls. As shown in FIG. 1, the array 100 includes a plurality of rail stacks extending the same direction and a plurality of bit lines 109A, 109B, 109C, 109D extending in a generally orthogonal direction. Preferably, an insulating fill material 145, such as silicon dioxide, spin-on glass or borophosphosilicate glass (BPSG) is located between adjacent rail stacks and between adjacent bit lines, as shown in FIG. 2.

In a preferred aspect of the invention, the array 100 comprises a monolithic, three dimensional array of thin film transistors formed above a substrate (not shown for clarity), as illustrated in FIGS. 1 and 2. The thin film transistors are located in a plurality of device levels 151, 251. A device level is monolithically formed over a lower device level when it is deposited on the lower device level layer by layer, instead of the entire upper device level being formed separately and then glued or bonded to the lower device layer.

The device levels 151, 251 are separated from each other by an insulating layer 153. While only two device levels 151, 251 are shown in FIGS. 1 and 2 for ease of illustration, a suitable number of additional device levels having a similar configuration to the device levels 151 and 251 may be monolithically formed over the second device level 251. For example, two to six additional device levels may be formed over the second device level 251.

In the preferred aspect of the first embodiment illustrated in FIGS. 1 and 2, both the first 151 and the second 251 device levels contain identical top gate staggered transistors. Thus, the second device level 251 (and additional device levels) also contains second bit lines 209, a second active semiconductor layer 221, a second tunneling dielectric 223, a plurality of second localized charge storage dielectrics 219, a second blocking dielectric 225, and a plurality of second word lines 207.

The effective cell size of the array 100 is about 4.8 to 6f$^2$/N, where f is the minimum feature size (i.e. 0.18 microns in a 0.18 micron semiconductor process) and N is number of device levels. The term "about" allows for small deviations (10% or less) due to non-uniform process conditions and other small deviations from desired process parameters. Thus, for a four level array, the effective cell size is about 1.2 to 1.5f$^2$.

The array of the first preferred embodiment is not limited to the layout shown in FIGS. 1 and 2. For example, the array may comprise a plurality of bottom gate thin film transistors instead of top gate thin film transistors. Thus, the array 100 structure shown in FIGS. 1 and 2 would be turned up-side down, with the bit lines being located above the active region of a transistor.

Figure 4:
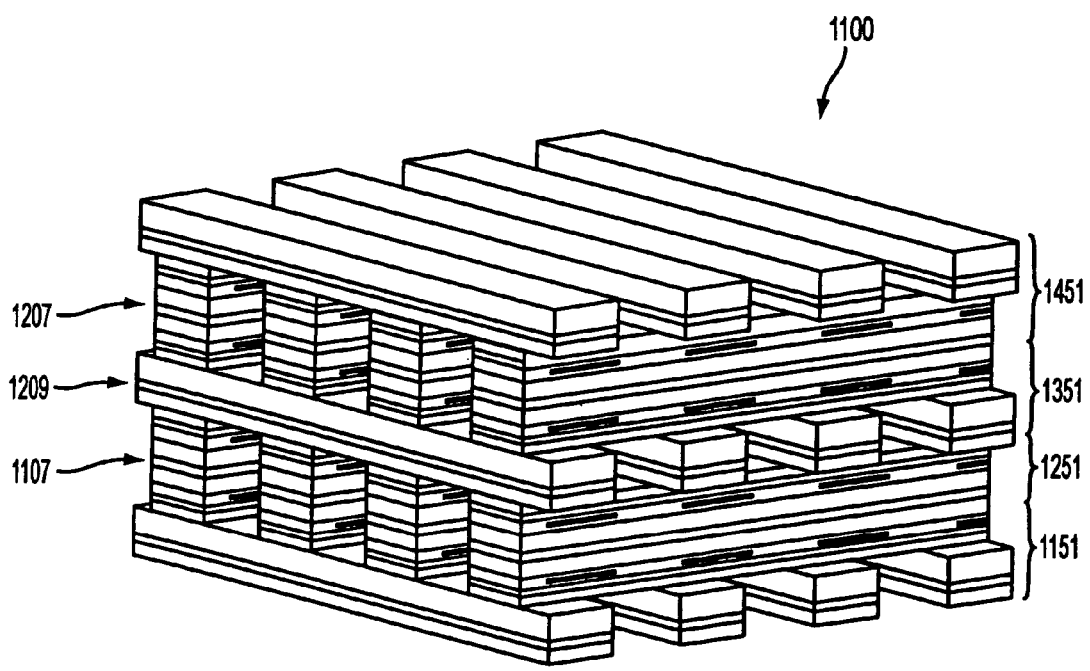
FIG. 4 is three dimensional view of an array according to an alternative aspect the first preferred embodiment of the present invention.

FIG. 4 illustrates another preferred layout of the array 1100 of the first preferred embodiment. The array 1100 contains both top gate and bottom gate thin film transistors in a "mirrored" configuration. This layout is advantageous because it allows the effective cell size of about 2.4 to 3f$^2$/N, such as about 0.6 to 0.75f$^2$ for a four level array.

As shown in FIG. 4, the array 1100 contains a plurality of top gate thin film charge storage transistors in a first set of device levels 1151, 1351, and a plurality of bottom gate thin film charge storage transistors in a second set of device levels 1251, 1451. The device levels 1151, 1351 of the first set of device levels alternate with the device levels 1251, 1451 of the second set of device levels in a vertical direction with respect to the substrate. For example, device level 1151 is the same as device level 151 shown in FIG. 1. However, device level 1251 of the second set of device levels shares word lines 1107 with an underlying device level 1151 of the first set of device levels. Device level 1251 of the second set of device levels shares bit lines 1209 with an overlying device level 1351 of the first set of device levels. Likewise device level 1351 shares word lines 1207 with an overlying device level 1451.

Figure 5:
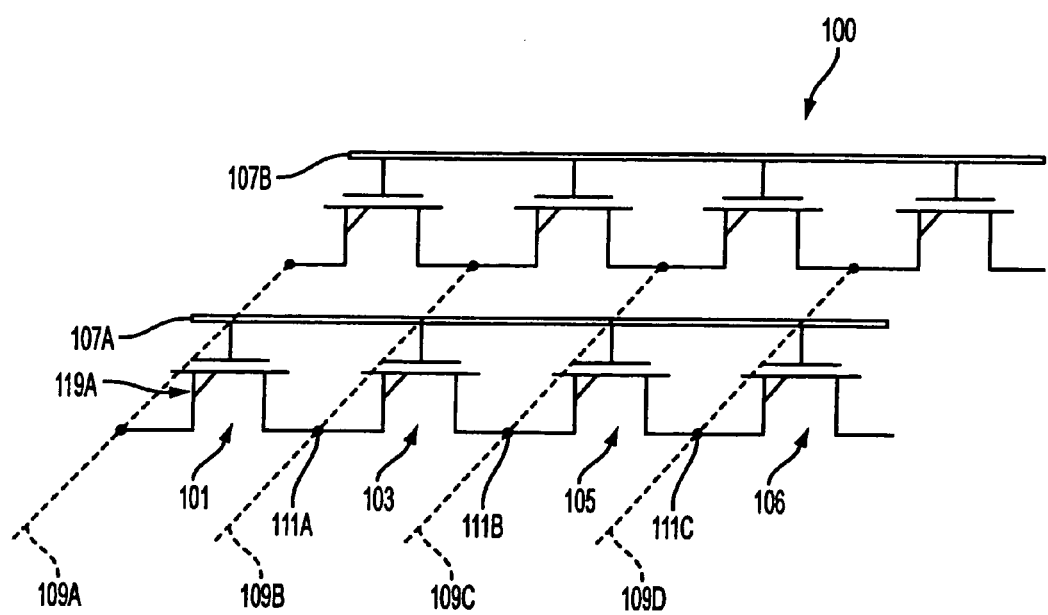
FIG. 5 is a circuit schematic of the array of the first preferred embodiment of the present invention.

FIG. 5 illustrates a circuit layout of a portion of the array 100 device level 151 shown in FIGS. 1 and 2. Since the charge storage is localized above the source of each transistor, isolation regions between adjacent transistors are not necessary. This allows transistors 101, 103, 105 and 106 to share common source/drains 111A, 111B, 111C and common bit lines 109B, 109C and 109D, in addition to sharing a common word line 107A. The charge localization also allows programming of each transistor of the array without affecting its neighbor. This leads to a higher density, disturb effect resistant memory in which each transistor is capable acting as a charge storage transistor.

The examples below illustrate preferred biasing conditions for program, erase and read operation for the arrays 100, 1100. It should be noted that the biasing schemes described herein are only preferred examples. Different product performance requirements will dictate which tradeoffs need to be made in choosing the appropriate biasing conditions. Also, when appropriate, the erase and/or program operations can be performed on a block of transistors similar to commercial flash memories, thus eliminating some of the disturb conditions. Table I summarizes the nomenclature used to describe the biasing conditions.

TABLE I

| | |
|---|---|
| VGsel | Gate voltage for the selected transistor |
| VDsel | Bit line (drain) voltage for the selected transistor |
| VSsel | Bit line (source) voltage for the selected transistor |
| VGunsel | Gate voltage for unselected transistors |
| VBunsel | Bit line voltage for unselected transistors |

To program a selected transistor of the array 100, a high programming voltage, VPP, is applied to the gate (i.e., word line) of the selected transistor with the drain held at a bit line programming inhibiting voltage, VPinhbtb, and the source grounded or set to a negative voltage. The programming inhibiting voltage is lower than the programming voltage. The magnitude of the programming inhibiting voltage is selected to inhibit programming of the unselected transistors. The neighboring transistor that shares its drain with the source of the selected transistor is not programmed, as electrons injected into the tunneling dielectric adjacent to the drain of the neighboring transistor do not encounter a localized charge storage dielectric to trap them.

While programming one or more selected transistors (i.e., cells) many other transistors on the selected word line are not to be programmed. The bit lines adjacent to the localized charge storage dielectric of all transistors not to be programmed are biased at the bit line programming inhibiting voltage, VPinhbtb. All word lines except for the selected word line are biased at a word line programming inhibiting voltage VPinhbtg so transistors on these word lines are not programmed.

In this biasing scheme, all transistors on the selected word line that are not to be programmed will have a gate-to-source line voltage of VPP-VPinhbtb, which is low enough not to disturb unprogrammed transistors. All transistors on the selected word line that are not to be programmed will also have a gate-to-drain line voltage of VPP-VPinhbtb, except that the transistor which shares its drain with the source of the selected transistor will have a gate-to-drain voltage of VPP. All transistors sharing the same drain and source bit lines with the selected transistor will be biased at a gate-to-source voltage of VPinhbtg and a gate-to-drain voltage of Vpinhbtg-VPinhbtb, which will not disturb unprogrammed transistors. Finally, all other cells will be biased with a gate-to-bit line voltage of VPinhbtg-VPinhbtb, which is very low and will not create any program or erase disturb.

Table II summarizes the biasing condition for the programming operation on the arrays 100, 1100. It should be noted that the voltages provided in Table II are preferred examples and should be not considered limiting on the scope of the invention. For example, the optimum voltages are selected depending on the disturb and program time constraints.

TABLE II

| | |
|---|---|
| VGsel | VPP (7–13 V, preferably 10 V) |
| VDsel | VPinhbtb (3–7 V, preferably 5 V) |
| VSsel | 0 V |
| VGunsel | VPinhbtg (3–7 V, preferably 5 V) |
| VBunsel | VPinhbtb (3–7 V, preferably 5 V) |

To erase the selected transistor, zero volts or a negative voltage is applied to its word line (i.e., gate). A high erase voltage, VEE, is applied to the source of the selected transistor, and a bit line erase inhibiting voltage, VEinhbtb, is applied to the drain of the selected transistor. The bit line erase inhibiting voltage is lower than the erase voltage. The magnitude of the bit line erase inhibiting voltage is selected to inhibit erasing of the unselected transistors. All bit lines for the unselected transistors are biased at VEinhbtb. All word lines except for the word line of the selected transistor are biased at the word line erase inhibiting voltage, VEinhbtg.

In this biasing scheme, all transistors on the selected word line will have a gate-to-bit line voltage of −VEinhbtb, which is low enough not to disturb programmed transistors. All unselected transistors sharing the same drain and source bit lines with the selected transistor will be biased at a gate-to-bit line voltage of VEE−VEinhbtb, which will not disturb programmed cells. Finally, all other unselected transistors will be biased with a gate-to-bit line of VEinhbtg−VEinhbtb, which is very low and will not create any program or erase disturb. If desired, all transistors controlled by a given word line can be erased at the same time. This can be achieved by driving the word line to 0V and all bit lines to VEE.

Table III summarizes the biasing condition for the erase operation on the arrays 100, 1100. It should be noted that the voltages provided in Table III are preferred examples and should be not considered limiting on the scope of the invention. For example, the optimum voltages are selected depending on the disturb and erase time constraints.

TABLE III

| | |
|---|---|
| VGsel | 0 V |
| VDsel | VEinhbtb (3–7 V, preferably 5 V) |
| VSsel | VEE (7–13 V, preferably 10 V) |
| VGunsel | VEinhbtg (3–7 V, preferably 5 V) |
| VBunsel | VEinhbtb (3–7 V, preferably 5 V) |

To read the selected transistors, the word line of the selected transistor is raised to an appropriate gate read voltage, VRDG, while the drain and source are biased to drain and source read voltages, VRDD and VRDS, respectively. The exact values of these voltages depend on the device characteristics and their statistical distribution. Preferably, VRDG is about 2–3 V, VRDD is about 2 V and VRDS is about 0.5 V. Thus, the VRDS magnitude is lower than that of VRDD.

All unselected word lines are grounded. Preferably, the unselected bit lines are allowed to float, except for the bit lines which contact transistors neighboring the selected transistor. The neighboring bit lines which are located adjacent to the source and drain of the selected transistor are precharged to a source and drain select voltages, Vdsel and Vssel, respectively, to avoid a leakage current. The range of voltages are selected such that the selected source and gate voltages are set to develop a gate to source voltage (VRDG−VRDS) that is lower than the threshold voltage of the storage device in its high-threshold state (usually programmed state) but higher than the threshold voltage in the low-threshold state (usually erased state). The selected drain voltage, VRDD, is optimized between a lower limit that is set by the minimum current that the selected device needs to deliver, and a maximum limit which is a maximum tolerable gate to drain voltage to avoid disturb.

For a high bandwidth reading operation, many transistors along the selected word line are read simultaneously. However, if it is desired to lower the leakage current, then the transistors neighboring the selected transistor are not read. The read operation is performed by sensing a current between the drain and source terminals of the selected transistors.

Table IV summarizes the biasing condition for the read operation on the arrays 100, 1100. It should be noted that the voltages provided in Table IV are preferred examples and should be not considered limiting on the scope of the invention.

TABLE IV

| | |
|---|---|
| VGsel | VRDG (1–3 V, preferably 2 V) |
| VBsel (drain) | VRDD (1–3 V, preferably 2 V) |
| VBsel (source) | VRDS (0.5–2 V, preferably 0.5 V) |
| VGunsel | 0 V |
| VBunsel | Matching adjacent Vbsel or Float |

Figure 6:
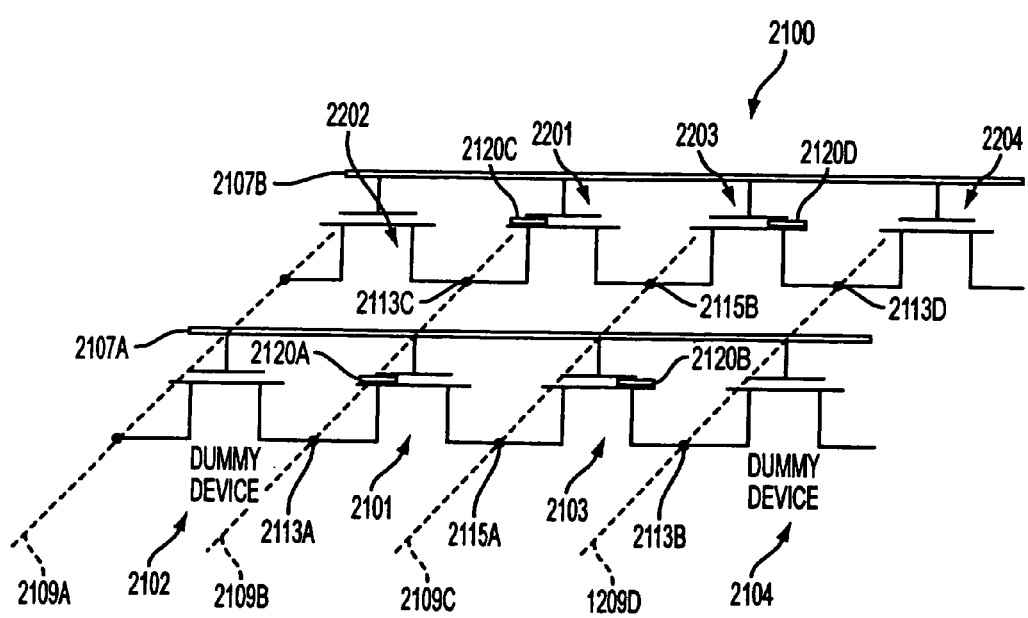
FIG. 6 is a circuit schematic of the array of the second preferred embodiment of the present invention.
Figure 7:
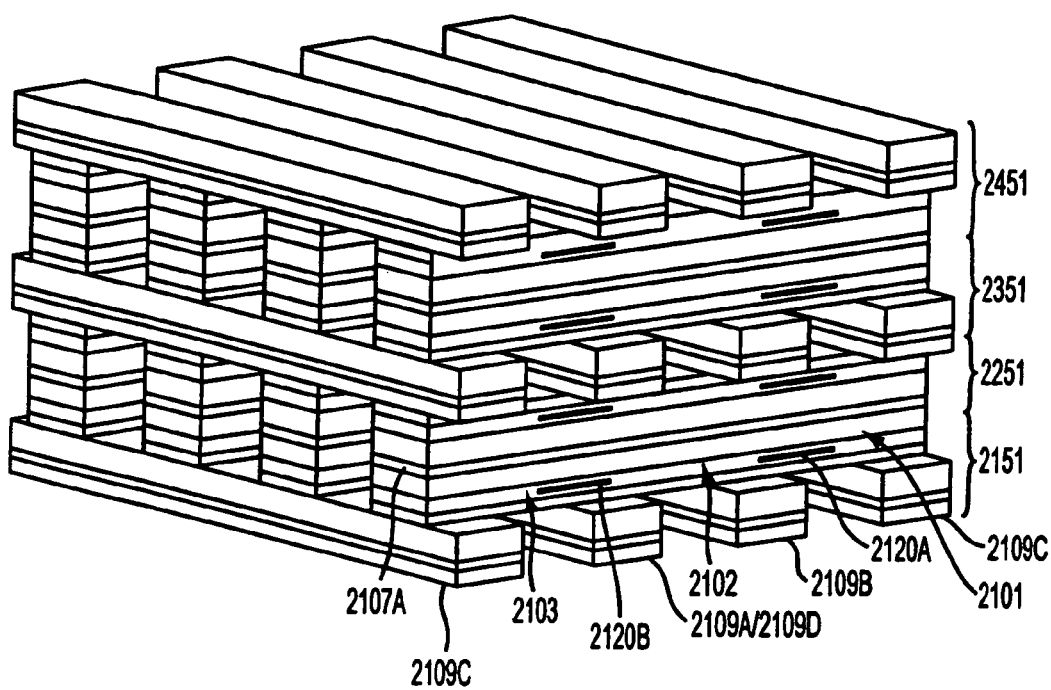
FIG. 7 is three dimensional view of an array according to the second preferred embodiment of the present invention.

FIG. 6 illustrates a circuit schematic of an array 2100 according to the second preferred embodiment of the present invention. FIG. 7 illustrates a three dimensional view of the array 2100. The array 2100 comprises a plurality of charge storage transistors 2101, 2103, 2201, 2203 and a plurality of dummy transistors 2102, 2104, 2202, 2204 interspersed with the charge storage transistors. Each charge storage transistor 2101, 2103, 2201, 2203 contains a respective charge storage region 2120A, 2120B, 2120C, 2120D that is located adjacent to a respective source 2113A, 2113B, 2113C, 2113D but not adjacent to a respective drain 2115A, 2115B of the charge storage transistor. Each dummy transistor 2102, 2104, 2202, 2204 lacks a charge storage region comprising a localized charge storage dielectric. Preferably, each dummy transistor has a higher threshold voltage than a programmed or an unprogrammed charge storage transistor.

Preferably, the charge storage region 2120A, 2120B, 2120C, 2120D in each respective charge storage transistor 2101, 2103, 2201, 2203 comprises the localized charge storage dielectric described with respect to the first preferred embodiment. Most preferably, the charge storage dielectric comprises a silicon nitride layer or material located between a silicon oxide tunneling dielectric and a silicon oxide blocking dielectric. In an alternative aspect of the second preferred embodiment, the charge storage region comprises a dielectric isolated floating gate.

The charge storage region, such as the localized charge storage dielectric, overlaps the respective source 2113A, 2113B, 2113C, 2113D and a portion of a respective channel located adjacent to the source of the respective charge storage transistor. However, the localized charge storage dielectric does not overlap the respective drain 2115A, 2115B and a portion of the channel located adjacent to the drain of the respective charge storage transistor. Thus, both localized charge storage dielectrics 2120A, 2120B of the adjacent charge storage transistors 2101, 2103 do not overlap the common drain 2115 shared by transistors 2101, 2103.

As in the first preferred embodiment, the charge storage region is offset from the drain of each charge storage transistor in a drain to source direction by a distance sufficient to avoid charge storage in the charge storage region when a programming voltage is applied between the drain and a gate electrode of each charge storage transistor. Thus, each charge storage transistor is programmed by Fowler-Nordheim tunneling such that electrons are trapped adjacent to the source in the charge storage region, but electrons are not trapped adjacent to the drain in a quantity sufficient to alter a threshold voltage of the transistor.

To program a selected charge storage transistor, such as transistor 2101, the gate programming voltage VPP is provided to the selected word line 2107A and a source programming voltage, VSS, is applied to the source bit line 2109B of the selected charge storage transistor 2101. VSS may be zero volts (i.e., ground) or a negative voltage. A gate programming inhibiting voltage VPinhbtg of smaller magnitude than VPP, such as about half VPP, is applied to all unselected word lines 2107B. A bit line programming inhibiting voltage VPinhbtb of smaller magnitude than VPP, is applied to all unselected bit lines. The dummy transistors 2102, 2202 preferably have a higher threshold voltage than VPinhbtg and conduct very little or no current to the selected source bit line 2109B at VSS. The dummy transistor 2102 which shares the source bit line and the word line with the selected charge storage transistor 2101 may contain a small leakage current at VPP.

In the read mode, the common word line 2107A for the selected transistor 2101 is preferably maintained at a gate read voltage of about 3 volts. The source bit lines are preferably maintained at a source read voltage of about 1 volt so that unprogrammed charge storage transistors with a low threshold voltage conduct while the programmed charge storage transistors having an about 2 V threshold voltage do not conduct. The dummy transistor 2102 does not conduct because of its high threshold voltage. Dummy transistor 2202 does not conduct because its word line 2107B is maintained at VSS. The erase operation is preformed as in the first embodiment.

As illustrated in FIGS. 6 and 7, the plurality of dummy transistors are interspersed with the plurality of charge storage transistors. The interspersed charge storage and dummy transistors are arranged in a plurality of rows extending in a first direction (i.e., left to right in FIGS. 6 and 7). The charge storage transistors and the dummy transistors in each row share a common word line 2107A, 2107B.

The array 2100 contains two types of charge storage transistors. The first type charge storage transistors 2101, 2201 are arranged in a set of first columns. Each first type charge storage transistor 2101, 2201 has the respective source 2113A, 2213C located on a left side of the transistor. Thus, as shown in FIG. 6, the first type transistors share the same source and drain bit lines 2109B, 2109C, respectively, but are controlled by different word lines, 2107A and 2107B.

The second type charge storage transistors 2103, 2203 are arranged in a set of second columns. Each second type charge storage transistor 2103, 2203 has the respective source 2113B, 2113D located on a right side of the transistor. Thus, as shown in FIG. 6, the second type transistors share the same source and drain bit lines 2109C, 2109D, respectively, but are controlled by different word lines, 2107A and 2107B.

The dummy transistors 2102, 2104, 2202, 2204 are arranged in a set of third columns. The first, the second and the third sets of columns extend in a different direction (i.e., in and out of the plane of FIGS. 6 and 7) from the direction of the rows (i.e., left to right). Each of the first columns containing the charge storage transistors 2101, 2201 with the source on the left side ("left side charge storage transistors") is located between a third and a second column. Each of the second columns containing the charge storage transistors 2103, 2203 with the source on the right side ("right side charge storage transistors") is located between a first and a third column. Each of the third columns containing the dummy transistors 2102 and 2104 or 2202 and 2204 is located between a second and a first column. Thus, while not shown in FIGS. 6 and 7 for clarity, another column of right side charge storage transistors 2103, 2203 is located to the left of the dummy transistors 2102, 2202 and another column of left side charge storage transistors 2101, 2201 is located to the right of the dummy transistors 2104, 2204.

Thus, each row comprises repeating units of three transistors. Each unit of three transistors contains one left charge storage transistor 2101 or 2201, one right side charge storage transistor 2103 or 2203 and one dummy transistor 2104 or 2204. The left side charge storage transistors 2101, 2201 share a common respective drain 2115A, 2115B and a common drain bit line 2109C with the respective right side charge storage transistors 2103, 2203. The right side charge storage transistors 2103, 2203 share a respective common source 2113B, 2213D and a common source bit line 2109D with the respective dummy transistors 2104, 2204. Each dummy transistor 2102, 2202 of one unit shares another common source 2113A, 2113C and a common source bit line 2109A with a respective left side charge storage transistor 2101, 2201 of an adjacent unit. Thus, as shown in FIGS. 6 and 7, the source bit line 2109A in one unit is the same as the source bit line 2109D in an adjacent unit, and the dummy transistors 2102, 2202 in one unit are the same as dummy transistors 2104, 2204 located in the adjacent unit.

The array 2100 may have any desired layout. Preferably, the dummy transistors and the charge storage transistors in the array 2100 comprise thin film transistors. Alternatively, the array 2100 may comprise transistors located in a semiconductor substrate or on an epitaxial semiconductor layer located on the semiconductor substrate.

The array 2100 may comprise a single device level. Preferably, the array 2100 comprises a monolithic three dimensional array of dummy and charge storage transistors, where the transistors are located in a plurality of device levels.

The transistors of the array 2100 may comprise top gate staggered thin film transistors similar to the transistors illustrated in FIG. 1. Alternatively, the transistors may comprise bottom gate staggered thin film transistors or a combination of top and bottom gate thin film transistors in a "mirrored" configuration, as shown in FIG. 7.

As shown in FIG. 7, the array 2100 contains a plurality of top gate thin film dummy and charge storage transistors in a first set of device levels 2151, 2351, and a plurality of bottom gate thin film dummy and charge storage transistors in a second set of device levels 2251, 2451. The device levels 2151, 2351 of the first set of device levels alternate with the device levels 2251, 2451 of the second set of device levels in a vertical direction with respect to the substrate. Device level 2251 of the second set of device levels shares word lines with an underlying device level 2151 of the first set of device levels. Device level 2251 of the second set of device levels shares bit lines with an overlying device level 2351 of the first set of device levels. Likewise device level 2351 shares word lines with an overlying device level 2451.

The present invention is not limited to the arrays 100, 1100, 2100 configuration shown in the Figures. Other array configurations, such as those described in U.S. published application 20020028541, incorporated herein by reference, may be used instead.

The arrays 100, 1100, 2100 of the preferred embodiments of the present invention may be made by any suitable method. Each layer of the transistors may be deposited over the substrate by any suitable method, such as chemical vapor deposition (CVD), atomic layer deposition (ALD) or physical vapor deposition (PVD), such as sputtering, methods. Insulating layers may also be thermally grown on silicon where a silicon surface is available. The layers may be patterned by any suitable technique, such as photolithographic masking and etching. Source and drain regions may be formed by ion implantation of dopants of a first conductivity type into the active layer of a second conductivity type or by outdiffusing dopants of a first conductivity type from polysilicon bit lines into the active layer of a second conductivity type.

Figure 8:
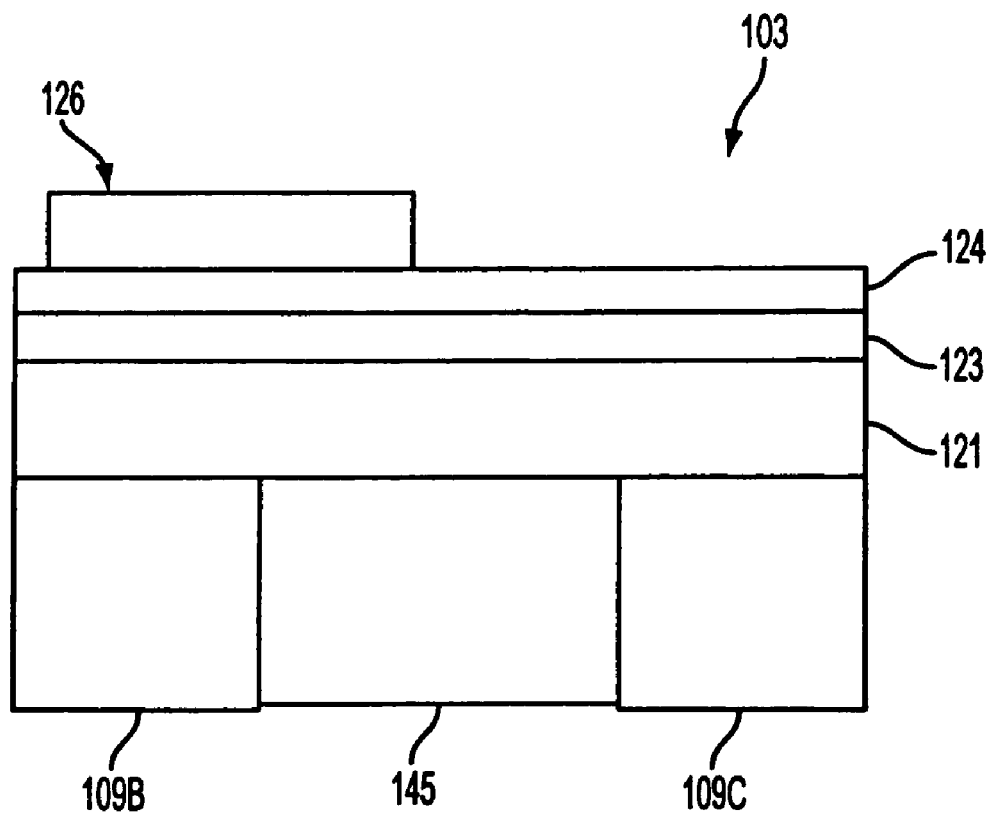
FIGS. 8–11 are side cross sectional views of steps in a method of making a transistor according to the preferred embodiments of the present invention.

To form the array 100 of the first preferred embodiment, the bit lines 109A, 109B, 109C and 109D are formed over the substrate. The bit lines may be formed by forming one or more conductive layers, such as a metal silicide layer between two heavily doped polysilicon layers, and photolithographically patterning the conductive layers to form the bit lines. An insulating fill material, such as silicon dioxide, is deposited between and over the patterned bit lines and planarized with the top of the bit lines by chemical mechanical polishing or etch back to form an insulating fill 145, as shown in FIG. 8.

An active region is formed on the bit lines 109A–109D and the insulating fill 145. For example, the active region may comprise a polysilicon layer 121 deposited on the bit lines and the fill. The polysilicon layer 121 may be deposited as an amorphous silicon layer and then recrystallized into the polysilicon layer. The polysilicon layer has an opposite conductivity type (i.e., p-type or n-type) to the conductivity type (i.e., n-type or p-type) of the bit lines.

The tunneling dielectric layer 123, such as a silicon dioxide layer, is then deposited or thermally grown on the active layer 121. A charge storage dielectric layer 124 is formed over the active layer 121 and on the tunneling dielectric layer 123. Preferably, the tunneling dielectric layer 124 comprises a silicon nitride layer. A photoresist or other photolithographic mask 126 is then formed over a first plurality of regions on the charge storage dielectric layer. One transistor 103 of the array 100 at this stage in the process is shown in FIG. 8. The mask 126 is formed on layer 124 over the source and the adjacent channel portion of the transistor, leaving the portion of layer 124 over the drain and the adjacent channel portion of the transistor exposed.

The charge storage dielectric layer 124 is then patterned using the mask 126 to form a plurality of localized charge storage dielectrics 119A–C shown in FIGS. 1 and 2. Layer 124 is patterned overlapping the source side of the transistors, such that when electrons are tunneled during programming, they will be only trapped above the source of the transistor. For example, layer 124 may be patterned by etching the layer 124. Preferably, the tunneling dielectric layer 123 is not completely removed during the etching step of layer 124. In other words, the etching step stops on layer 123 rather than on the active layer 121. This prevents over etching of the active layer 121 and avoids a non-uniform upper surface of the transistor channel region. However, if desired, the exposed portion of the tunneling dielectric layer 123 may also be removed during this etching step.

Figure 9:
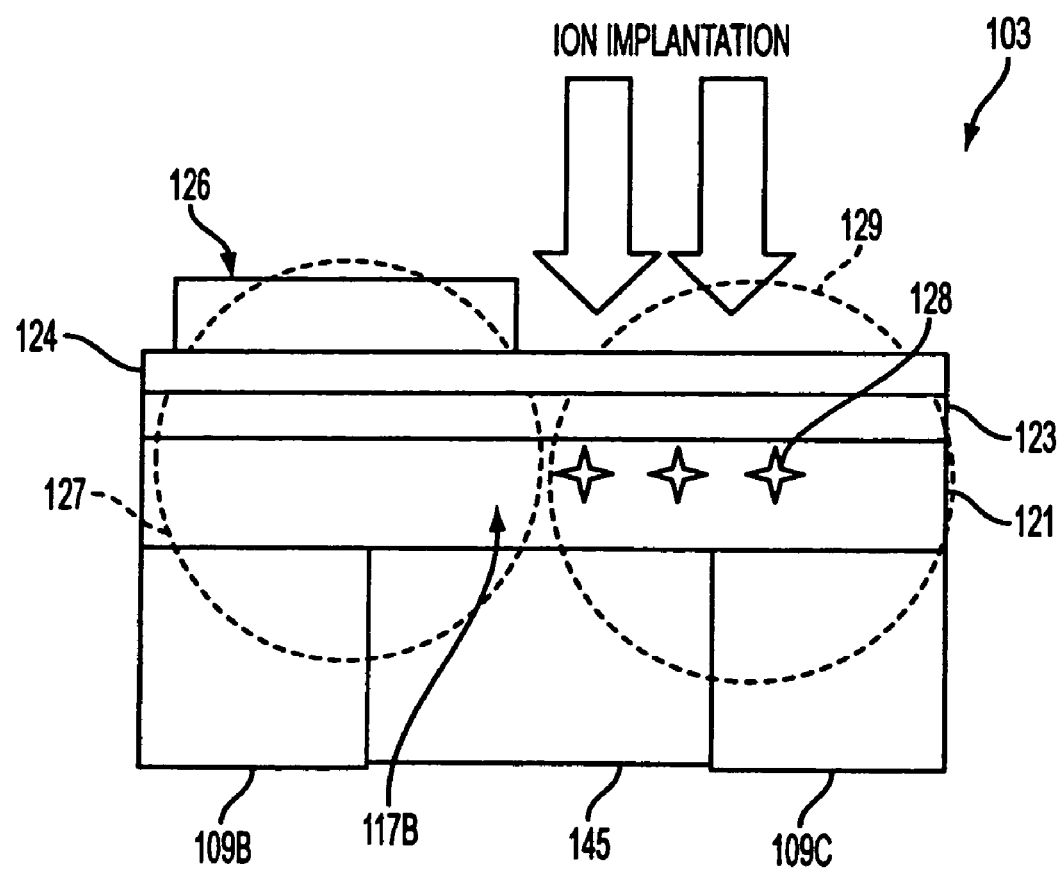

In one optional aspect of the method of the present invention, threshold voltage adjusting dopants 128 are selectively implanted into the exposed portions of active layer 121 through the charge storage dielectric layer 124 and through the tunneling dielectric layer 123 using the mask 126, as shown in FIG. 9. The dopants are of the same conductivity type as the channel conductivity type (i.e., p type dopants are implanted into a p type doped channel). Since the first transistor portion 127 is covered by the mask 126, the dopants 128 are only implanted into the exposed portion of layer 121 in the second transistor portion 129. Thus, the channel region 117B of the transistor 103 located in layer 121 contains a lower concentration of the threshold voltage adjustment dopants of a first conductivity type in the left channel portion than in the right channel portion, as shown in FIG. 9. This asymmetry in the channel doping reduces leakage currents in the transistor.

In an alternative aspect of the invention, the threshold voltage implant is performed after layer 124 is patterned but before the mask 126 is removed. In another alternative aspect of the invention, this implant is performed using a different mask from mask 126.

Figure 10:
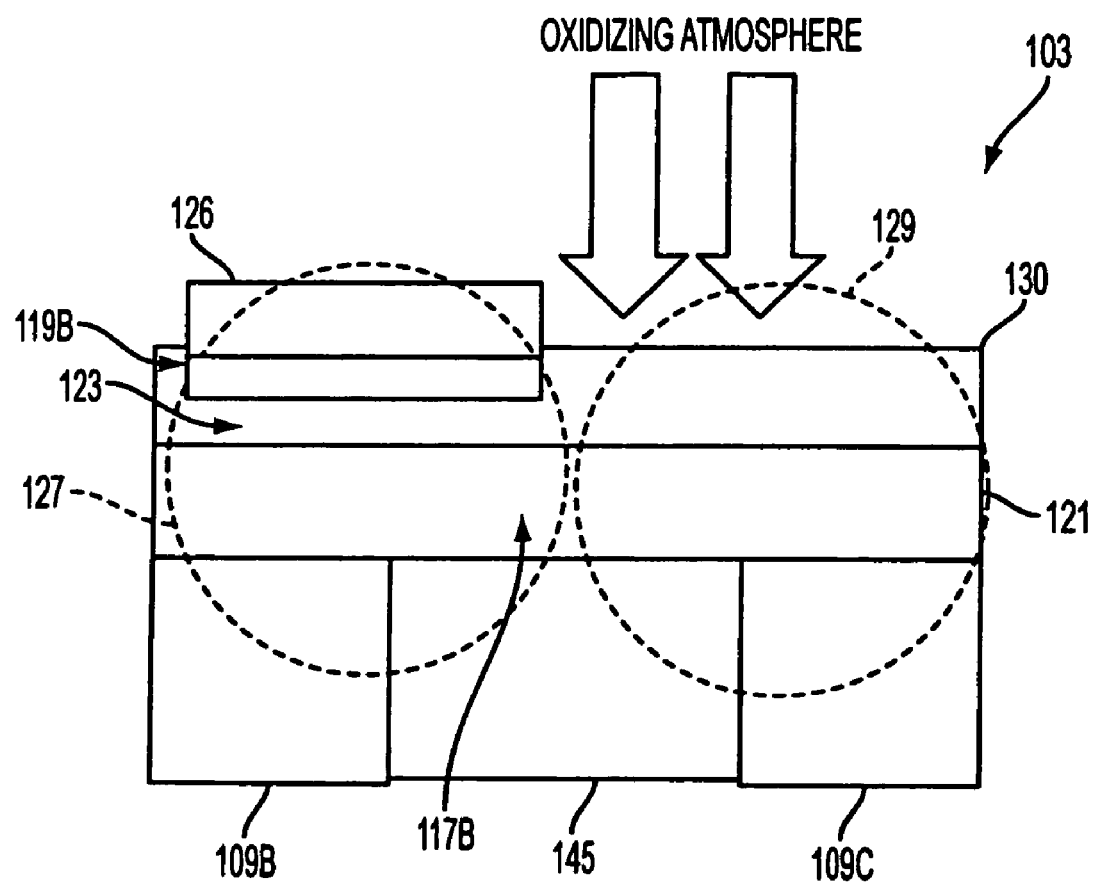

In another optional aspect of the present invention, a selective oxidation step is performed after the selective removal of layer 124, as shown in FIG. 10. The selective oxidation step is preferably a thermal oxidation step, similar to the LOCOS (local oxidation of silicon) process, where the exposed tunneling dielectric layer 123 is exposed to an oxidizing atmosphere to grow a thicker silicon dioxide layer 130 in the areas exposed by the mask 126. The thick silicon dioxide layer 130 results from oxidation of the active layer 121 and conversion of the top portion layer 121 to silicon dioxide.

The oxidation step selectively increases the insulating layer thickness in the second transistor portion 129 compared to the first transistor portion 127. In other words, the tunneling dielectric 123 is thinner in transistor portion 127 than in portion 129. When the blocking dielectric 125 is formed on the tunneling dielectric 123 and on the localized charge storage dielectric 119B, a combined thickness of the tunneling dielectric 123/130 and the blocking dielectric 125 in the second transistor portion 129 is greater than a combined thickness of the tunneling dielectric 123, the localized charge storage dielectric 119B and the blocking dielectric 125 in the first transistor portion 127, as shown in FIG. 11.

This asymmetry in the transistor 103 insulating layer thickness below the word line produces a threshold voltage adjustment. The threshold voltage in the first transistor portion 127 is different (i.e., less than) the threshold voltage in the second transistor portion 129. This reduces leakage currents. For example when the source bit line 109B is pulled low for reading or programming transistor 103, transistor 101 does not conduct or conducts less current than it would have without the selective oxidation. If desired, the selective oxidation of FIG. 10 may be used alone or in combination with the threshold voltage adjustment implant of FIG. 9 to produce even larger threshold voltage adjustment. Of course, the selective oxidation and the implant may both be omitted to simplify the array fabrication method.

If the array 2100 of FIGS. 6 and 7 is being fabricated, then the mask 126 is formed only over the charge storage transistor portions of the array, while leaving the entire dummy transistor portions of the array exposed. During the step of etching the charge storage dielectric layer 124, this layer 124 is removed from locations overlying the dummy transistors. Thus, the finished dummy transistors do not contain the localized charge storage dielectric. The size of the charge storage transistors may be the same as or different than the size of the dummy transistors. In one aspect of the invention, the size of each charge storage transistor may be slightly larger than the size of each dummy transistor because patterning of layer 124 is not self-aligned to the channels of the transistors. For the array 2100, the effective cell size is the sum of the size of a half of a dummy transistor plus the size of one charge storage transistor. Thus, the effective cell size for array 2100 is about $6.4f^2/N$.

Figure 11:
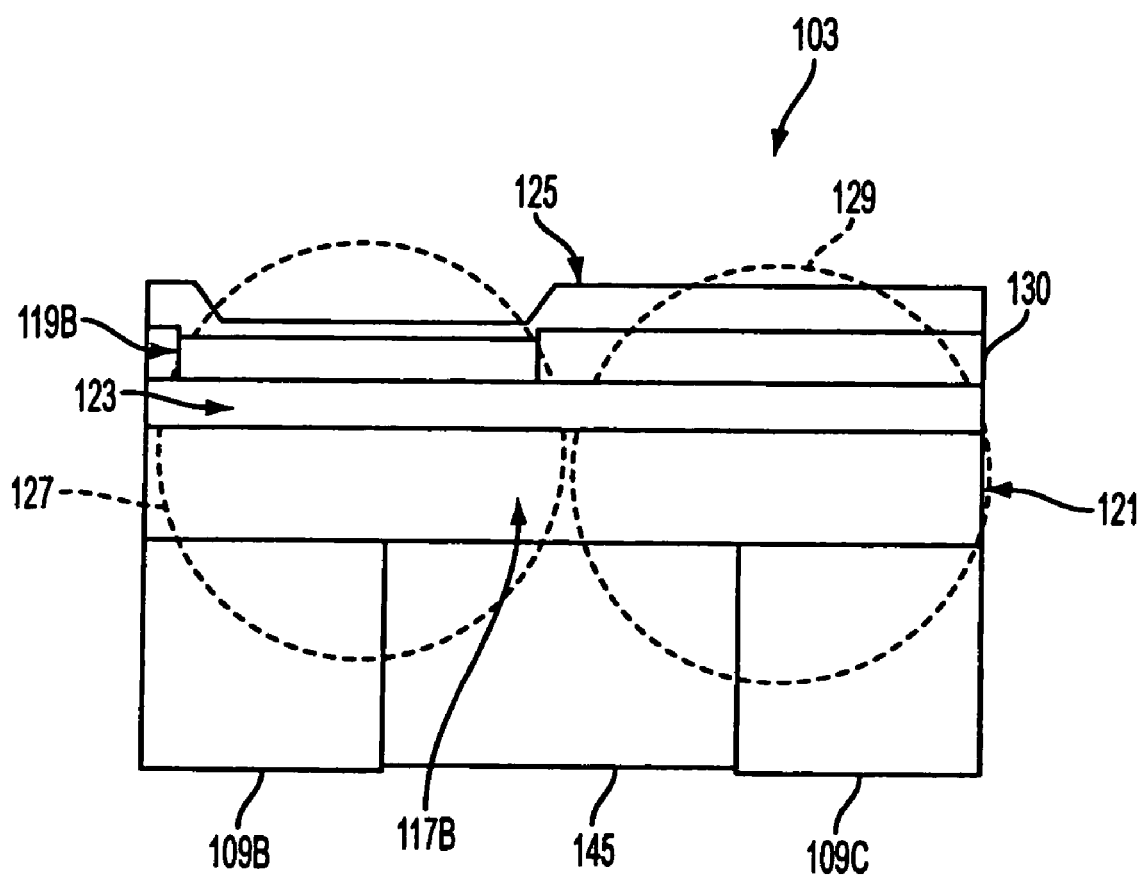

After forming the localized charge storage dielectric 119B, the blocking dielectric layer 125 is formed on the localized charge storage dielectric 119B, as shown in FIGS. 3 and 11. The blocking dielectric layer 125 contacts the tunneling dielectric layer 123 in the second transistor portion 129 where the charge storage dielectric layer 124 has been removed.

Referring to FIGS. 1 and 2, a word line film is then formed on the blocking dielectric 125. The word line film may comprise a metal silicide layer 131 located between two polysilicon layers 133, 135, as shown in FIG. 2. The word line film is then patterned into a plurality of word lines 107A, 107B, 107C, 107D, as shown in FIG. 1, using a photolithographic mask. Preferably, the word line film, the blocking dielectric layer 125, the localized charge storage dielectrics 119A–C, the tunneling dielectric 123 and the polysilicon active layer 121 are etched together using the same mask to form a plurality of rails 143 extending generally orthogonal to the bit lines 109A–D.

If it is desired to form sources and drains in the polysilicon active layer 121 rather than just in portions of the bit lines 109A–D, then an annealing step is performed to outdiffuse source and drain dopants from the heavily doped polysilicon layer 141 in bit lines into the polysilicon active layer 121 to form at least portions of sources and drains in the polysilicon active layer.

If bottom gate thin film transistors, such as transistors located in device levels 1251 and 1451 of FIG. 4 are formed, then the order of steps described above is reversed. The word line film is formed first, then the blocking dielectric layer is formed on the word line film and the charge storage dielectric layer is formed on the blocking dielectric layer. The charge storage dielectric layer is then patterned to form the localized charge storage dielectrics using a mask, preferably without also patterning the blocking dielectric layer. The tunneling dielectric layer is formed on the localized charge storage dielectrics such that the tunneling dielectric contacts the blocking dielectric in the second lateral transistor portions where the charge storage dielectric layer has been removed. A polysilicon active layer is then formed on the tunneling dielectric.

A mask is formed over the polysilicon active layer. The polysilicon active layer, the blocking dielectric, the localized charge storage dielectrics, the tunneling dielectric and the word line film are patterned using the mask to form a plurality of rails. A first insulating fill is formed between the rails. At least portions of sources and drains are formed in the polysilicon active layer, by a method such as ion implantation. A plurality of bit lines are then formed on the polysilicon active layer and on the first insulating fill, and a second insulating fill is formed between the bit lines.

Preferably, the array is formed as a monolithic three dimensional array of device levels, as illustrated in FIGS. 1, 2, 4 and 7. In this case, the method further comprises monolithically forming a plurality of thin film transistors in a plurality of vertically stacked device levels.

For example, after a plurality of first top gate thin film transistors of are formed in the first device level 1151 of array 1100 shown in FIG. 4, a plurality of second bottom gate thin film transistors are monolithically formed in the second device level 1251 over the plurality of first top gate thin film transistors. Each of the second bottom gate transistors in level 1251 contains a second localized charge storage dielectric located under a second source but not under a second drain. Then, a plurality of third top gate thin film transistors of the third device level 1351 are monolithically formed over the plurality of second bottom gate thin film transistors. Each of the third top gate transistors in level 1351 contains a third localized charge storage dielectric located over a third source but not over a third drain. Then, a plurality of fourth bottom gate thin film transistors of device level 1451 are monolithically formed over the plurality of third top gate thin film transistors in level 1351. Each of the fourth bottom gate transistors in level 1451 contains a fourth localized charge storage dielectric located under a fourth source but not under a fourth drain.

The foregoing description of the invention has been presented for purposes of illustration and description. It is not intended to be exhaustive or to limit the invention to the precise form disclosed, and modifications and variations are possible in light of the above teachings or may be acquired from practice of the invention. The drawings and description were chosen in order to explain the principles of the invention and its practical application. The drawings are not necessarily to scale and illustrate the array in schematic block format. It is intended that the scope of the invention be defined by the claims appended hereto, and their equivalents.

What is claimed is:

1. A method of making an array of transistors, comprising:
    first forming an active region or a word line film;
    second forming a charge storage dielectric layer over the active region or the word line film;
    third forming a first mask over a first plurality of regions on the charge storage dielectric layer;
    fourth patterning the charge storage dielectric layer using the first mask to form a plurality of localized charge storage dielectrics; and
    fifth forming the word line film over the plurality of localized charge storage dielectrics if the active region was formed first, or forming the active region over the plurality of localized charge dielectrics if the word line film was formed first;
    wherein each transistor of the array of transistors comprises:
        a first lateral transistor portion comprising (i) a source; (ii) a first channel portion located adjacent to the source; and (iii) one of the localized charge storage dielectrics; and
        a second lateral transistor portion comprising (i) a drain and (ii) a second channel portion located adjacent to the drain, wherein the second transistor portion excludes a localized charge storage dielectric.

2. The method of claim 1, further comprising forming a tunneling dielectric and a blocking dielectric which are located in the first lateral transistor portion and in the second lateral transistor portion of each transistor.

3. The method of claim 2, wherein:
    the step of forming the active region occurs before the step of forming the word line film;

forming the tunneling dielectric comprises forming the tunneling dielectric on the active region;

forming the charge storage dielectric layer comprises forming the charge storage dielectric layer on the tunneling dielectric;

patterning the charge storage dielectric layer comprises patterning the charge storage dielectric layer without patterning the tunneling dielectric;

forming the blocking dielectric comprises forming the blocking dielectric on the localized charge storage dielectrics such that the blocking dielectric contacts the tunneling dielectric in the second lateral transistor portions where the charge storage dielectric layer has been removed; and forming the word line film comprises forming the word line film on the blocking dielectric.

4. The method of claim 3, further comprising selectively implanting threshold voltage adjusting dopants into the active region using the first mask as a mask.

5. The method of claim 3, further comprising selectively forming a silicon oxide dielectric using the first mask as a mask in the second lateral transistor portions where the charge storage dielectric layer has been removed.

6. The method of claim 3, wherein the active region comprises a portion of a single crystal semiconductor substrate or an epitaxial layer located on the single crystal semiconductor substrate.

7. The method of claim 3, wherein the active region comprises a polysilicon active layer.

8. The method of claim 7, further comprising:

forming a plurality of bit lines extending in a first direction;

forming an insulating fill between the bit lines;

depositing the polysilicon active layer on the bit lines and the insulating fill to perform the step of forming the active region;

outdiffusing source and drain dopants from the bit lines into the polysilicon active layer to form at least portions of sources and drains in the polysilicon active layer separated by channels;

forming a second mask over the word line film located on the blocking dielectric; and patterning the word line film, the blocking dielectric layer, the localized charge storage dielectrics, the tunneling dielectric and the polysilicon active layer using the second mask to form a plurality of first rails extending in a second direction different than the first direction.

9. The method of claim 2, wherein:

the step of forming the active region occurs after the step of forming the word line film;

forming the blocking dielectric comprises forming the blocking dielectric on the word line film;

forming the charge storage dielectric layer comprises forming the charge storage dielectric layer on the blocking dielectric;

patterning the charge storage dielectric layer comprises patterning the charge storage dielectric layer without patterning the blocking dielectric;

forming the tunneling dielectric comprises forming the tunneling dielectric on the localized charge storage dielectrics such that the tunneling dielectric contacts the blocking dielectric in the second lateral transistor portions where the charge storage dielectric layer has been removed; and forming the active region comprises forming a polysilicon active layer on the tunneling dielectric.

10. The method of claim 9, further comprising:

forming a second mask over the polysilicon active layer;

patterning the polysilicon active layer, the blocking dielectric, the localized charge storage dielectric, the tunneling dielectric and the word line film using the second mask to form a plurality of first rails extending in a first direction;

forming a first insulating fill between the first rails;

forming at least portions of sources and drains in the polysilicon active layer separated by channels;

forming a plurality of bit lines extending in a first direction on the polysilicon active layer and on the first insulating fill; and forming a second insulating fill between the bit lines.

11. The method of claim 1, further comprising monolithically forming a plurality of thin film transistors in a plurality of vertically stacked device levels, wherein each of the thin film transistors comprises a localized charge storage dielectric located over a source but not over a drain.

12. The method of claim 11, further comprising:

forming a plurality of first top gate thin film transistors, wherein each of the first top gate transistors comprises a first localized charge storage dielectric located over a first source but not over a first drain;

monolithically forming a plurality of second bottom gate thin film transistors over the plurality of first top gate thin film transistors, wherein each of the second bottom gate transistors comprises a second localized charge storage dielectric located under a second source but not under a second drain;

monolithically forming a plurality of third top gate thin film transistors over the plurality of second bottom gate thin film transistors, wherein each of the third top gate transistors comprises a third localized charge storage dielectric located over a third source but not over a third drain; and monolithically forming a plurality of fourth bottom gate thin film transistors over the plurality of third top gate thin film transistors, wherein each of the fourth bottom gate transistors comprises a fourth localized charge storage dielectric located under a fourth source but not under a fourth drain.

* * * * *